United States Patent
Widdicks et al.

(10) Patent No.: US 9,957,608 B2
(45) Date of Patent: May 1, 2018

(54) COMPOSITE SHIELDING

(75) Inventors: Clive Luca Widdicks, Bristol (GB); Ian Moncrieff, Wickwar (GB)

(73) Assignee: SPTS TECHNOLOGIES LIMITED, Newport, Gwent (GB)

( * ) Notice: Subject to any disclaimer, the term of this patent is extended or adjusted under 35 U.S.C. 154(b) by 0 days. days.

(21) Appl. No.: 13/371,642

(22) Filed: Feb. 13, 2012

(65) Prior Publication Data

US 2013/0042812 A1 Feb. 21, 2013

Related U.S. Application Data

(60) Provisional application No. 61/443,781, filed on Feb. 17, 2011.

(30) Foreign Application Priority Data

Feb. 11, 2011 (GB) .................................... 1102447.8

(51) Int. Cl.
*H01J 37/34* (2006.01)
*C23C 14/56* (2006.01)

(52) U.S. Cl.
CPC ........ *C23C 14/564* (2013.01); *H01J 37/3411* (2013.01)

(58) Field of Classification Search
CPC .................................................. H01J 37/3411
See application file for complete search history.

(56) References Cited

U.S. PATENT DOCUMENTS

| 5,202,008 A | 4/1993 | Talieh et al. | |
| 5,942,042 A * | 8/1999 | Gogh | 118/728 |
| 6,231,674 B1 | 5/2001 | Chen et al. | |
| 6,562,715 B1 * | 5/2003 | Chen et al. | 438/643 |
| 2003/0185965 A1 * | 10/2003 | Lin | C23C 4/12 427/8 |
| 2005/0089699 A1 | 4/2005 | Lin et al. | |
| 2007/0158188 A1 | 7/2007 | Ivanov | |
| 2007/0283884 A1 * | 12/2007 | Tiller et al. | 118/715 |
| 2008/0178801 A1 * | 7/2008 | Pavloff et al. | 118/504 |
| 2008/0230371 A1 * | 9/2008 | McHugh | C23C 14/564 204/192.1 |
| 2008/0305634 A1 | 12/2008 | Igarashi | |

(Continued)

FOREIGN PATENT DOCUMENTS

| EP | 0853331 A2 | 7/1998 |
| EP | 1953798 A2 | 8/2008 |

(Continued)

OTHER PUBLICATIONS

Great Britain Search Report for GB1102747.1 dated Jul. 15, 2011.

(Continued)

*Primary Examiner* — Timon Wanga
(74) *Attorney, Agent, or Firm* — Volentine, Whitt & Francos, PLLC

(57) ABSTRACT

A composite shield assembly is for use in deposition apparatus defining a work piece location. The assembly includes a first shield element for position circumjacent the work piece location and a second shield element for extending around and carrying the first element. The thermal conductivity of the first element is greater than that of the second element, and the elements are arranged for intimate thermal contact.

20 Claims, 4 Drawing Sheets

Composite shielding in PVD chamber

(56) References Cited

U.S. PATENT DOCUMENTS

| | | | |
|---|---|---|---|
| 2009/0260982 A1* | 10/2009 | Riker et al. | 204/298.11 |
| 2010/0218785 A1* | 9/2010 | Green | C23C 14/50 134/1.1 |
| 2010/0270143 A1* | 10/2010 | Kikuchi et al. | 204/192.2 |
| 2011/0186426 A1* | 8/2011 | Hawrylchak et al. | 204/298.11 |

FOREIGN PATENT DOCUMENTS

| | | | |
|---|---|---|---|
| JP | 2003247057 A | 9/2003 | |
| JP | 2003247058 A | 9/2003 | |
| JP | 2003247059 A | 9/2003 | |
| JP | 2004315948 A | 11/2004 | |
| JP | 2008291299 A | 12/2008 | |

OTHER PUBLICATIONS

European Search Report for EP 12 15 2912 dated Jul. 2, 2012.
Japanese Office Action in Corresponding Japanese Application No. 2012-027506 dated Sep. 29, 2015.

* cited by examiner

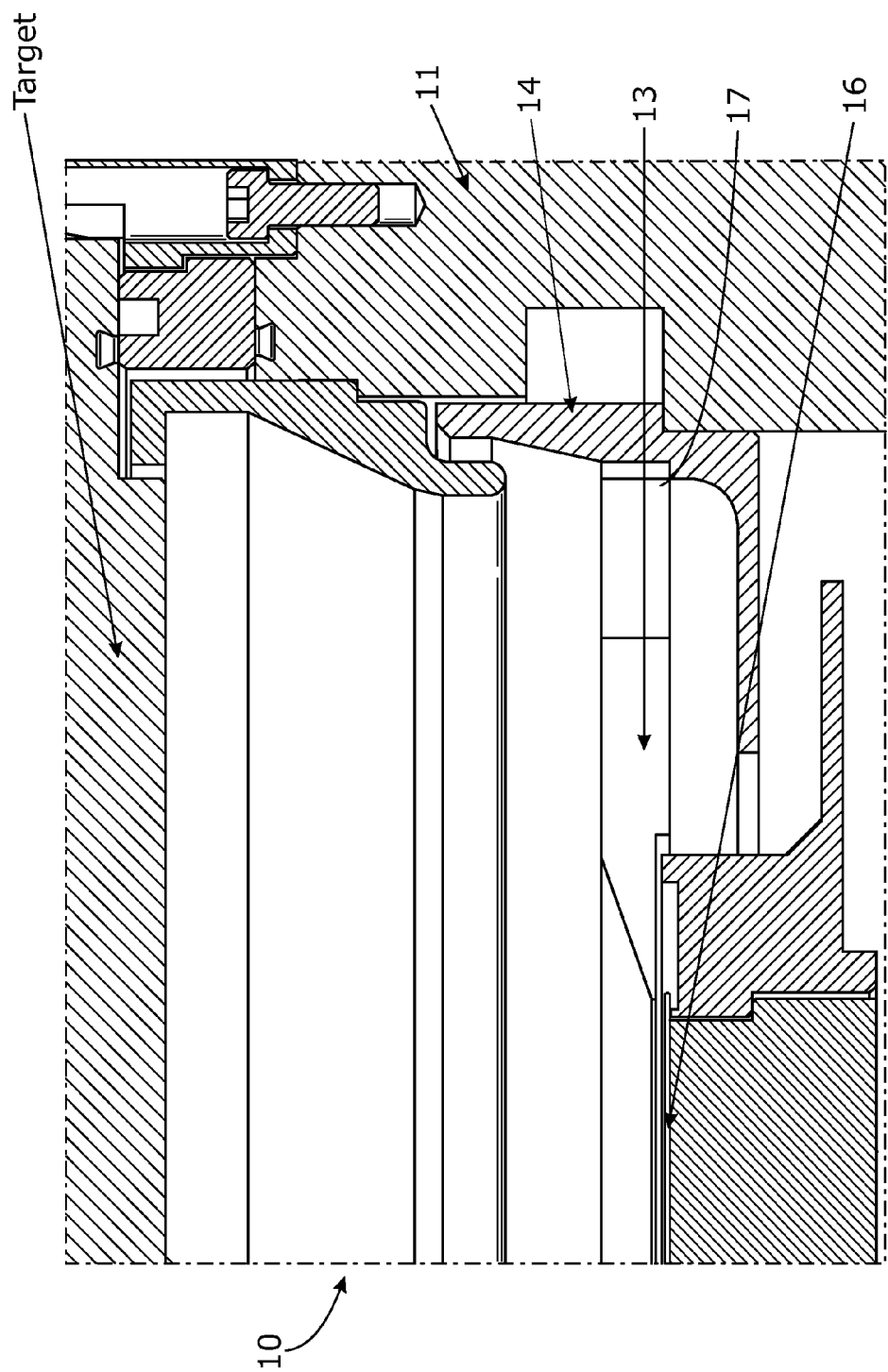
Fig. 1 Composite shielding in PVD chamber

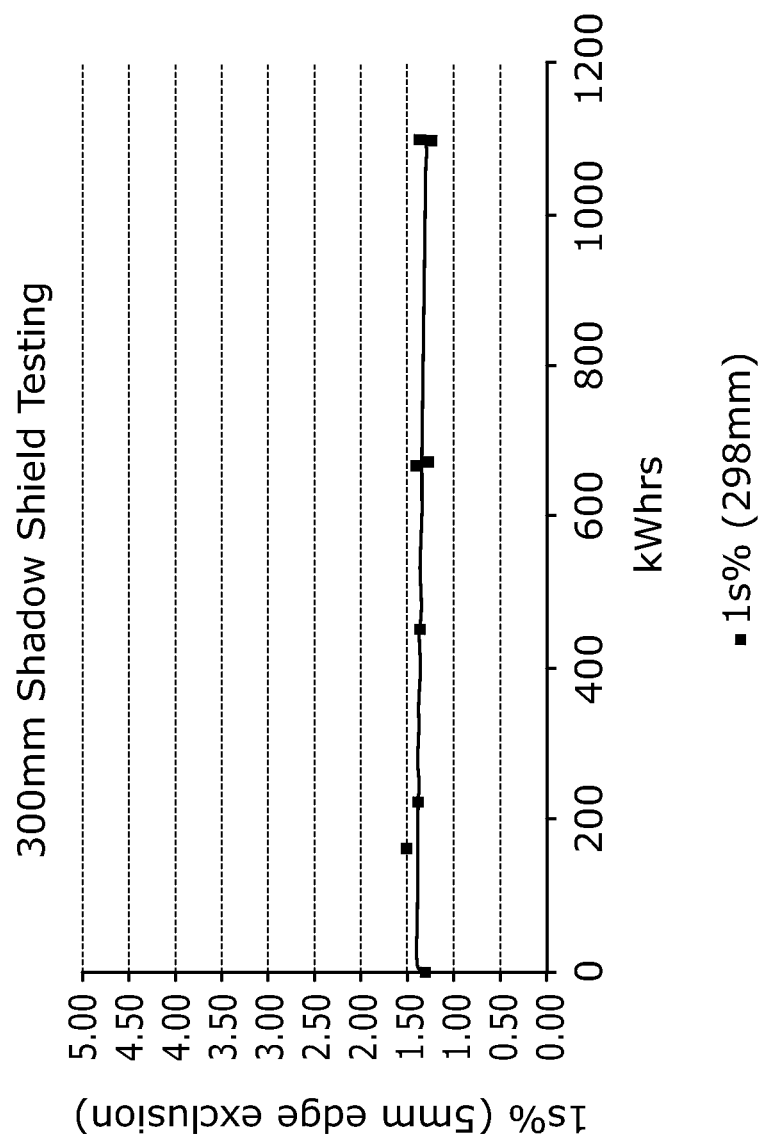
Fig. 3 Thickness uniformity (1 sigma) of a 3μm, high power Al(Cu) deposition as a function of target life (kWhrs)

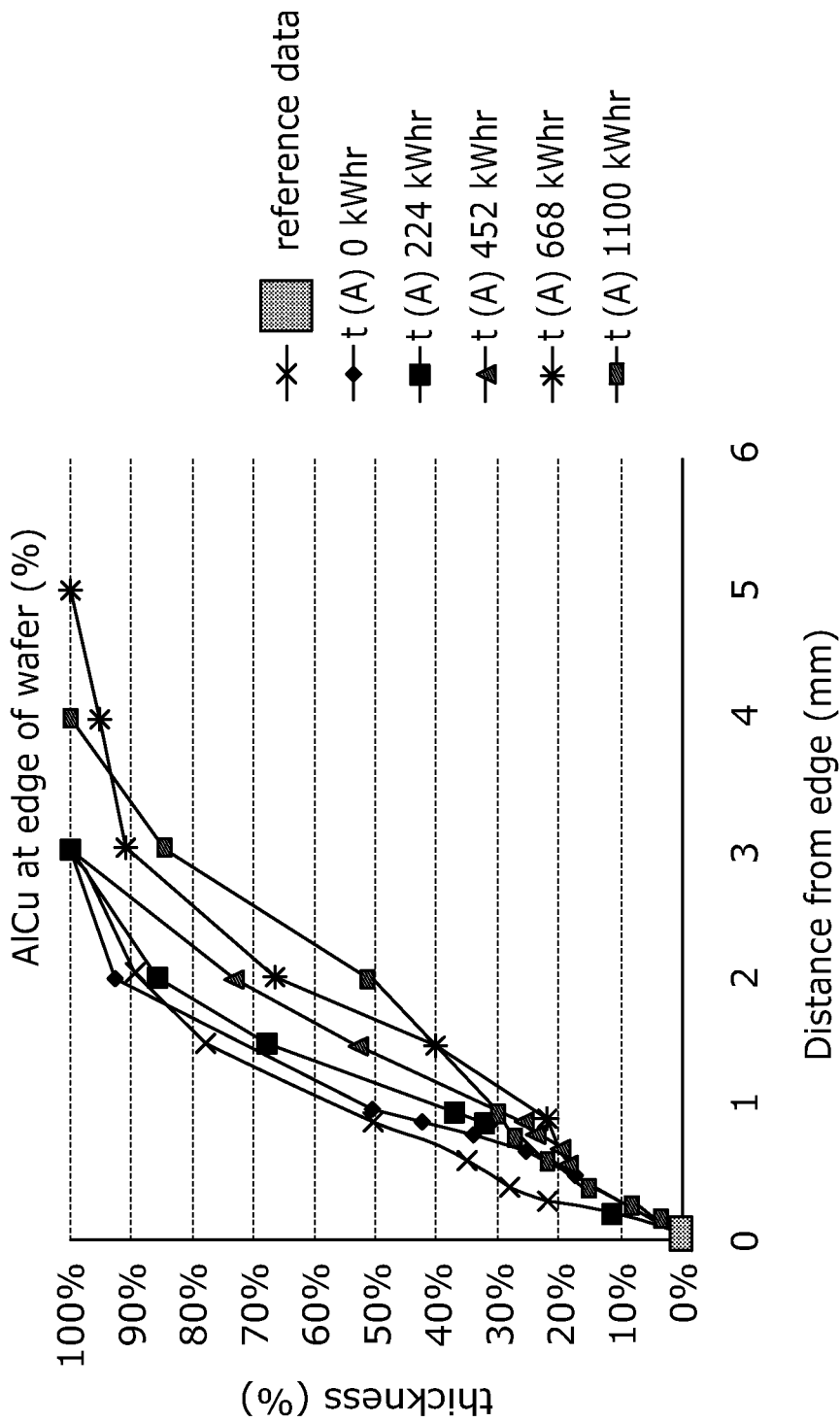
Fig. 4 Relative edge thickness (%) as a function of distance from the edge of the wafer and target life.

COMPOSITE SHIELDING

BACKGROUND

Shielding design is an important factor in the reliable operation of PVD tools. The shielding has to contain deposited material, to avoid deposition on the chamber walls for example, retain this material for as long as possible, ideally a full target life without release of particles, be simple to replace, be low cost and have no adverse effect on the film coating on the wafer.

Typically stainless steel shielding is used in PVD systems as robust, relatively complex assemblies can be constructed which can be simple to install in the process chamber and are relatively cost effective as they can be cleaned and re-used.

When high power deposition processes are carried out, i.e. >30 kW, the heat load on the stainless steel shielding can cause distortion (due to the fact that stainless steel is a relatively poor thermal conductor) which in turn will result in particles being ejected from the shielding. This is not acceptable for standard operating conditions. While shielding could be made from a metal with better thermal properties, e.g. Aluminium this tends to be costly to fabricate and impractical to clean. Cleaning aluminium is difficult and when tight dimensional tolerance is important (to maintain film uniformity on the wafer for example) it is not practical to re-use the material.

SUMMARY

The invention seeks to provide a practical solution for high power deposition process by using a composite shielding assembly. The shielding assembly uses both stainless steel and aluminium components which when installed in the system behave as a single assembly. In the regions where the heat load is high aluminium is used. This enables prolonged high power operation while maintaining excellent process performance. When the shielding is to be changed the aluminium part may be disposed of while the stainless steel assembly is cleaned and re-used.

Thus from one aspect the invention consists in a composite shield assembly for use in deposition apparatus defining a workpiece location, the assembly, including:

a first shield element for positioning circumjacent the workpiece location; and a second shield element for extending around and carrying the first element wherein the thermal conductivity of the first element is greater than that of the second element and the elements are arranged for intimate thermal contact.

It will be understood that a shield element is a bulk structure and not merely a coating.

The first element may be aluminium or an alloy thereof and the second element stainless steel. The first element may be a press or friction fit in the second.

The invention also includes a deposition chamber including a workpiece location and an assembly as defined above.

The second element may mount the first on a wall of the chamber. The first element may lie circumjacent the workpiece location to constitute a shadow shield. The second element may form a shield for part of the chamber.

Although the invention has been defined above it is to be understood it includes any inventive combination of the features set out above or in the following description.

BRIEF DESCRIPTION OF THE DRAWINGS

The invention may be performed in various ways and a specific embodiment will now be described, by way of example, with reference to the accompanying drawings in which:

FIG. 1 is a vertical section through one half of a part of a Physical Vapour Deposition (PVD) chamber;

FIG. 3 is a graph of thickness uniformity as a function of target life; and

FIG. 4 is a graph indicating deposition thicknesses with respect to the wafer edge.

DETAILED DESCRIPTION OF EMBODIMENTS

Figure 2A:
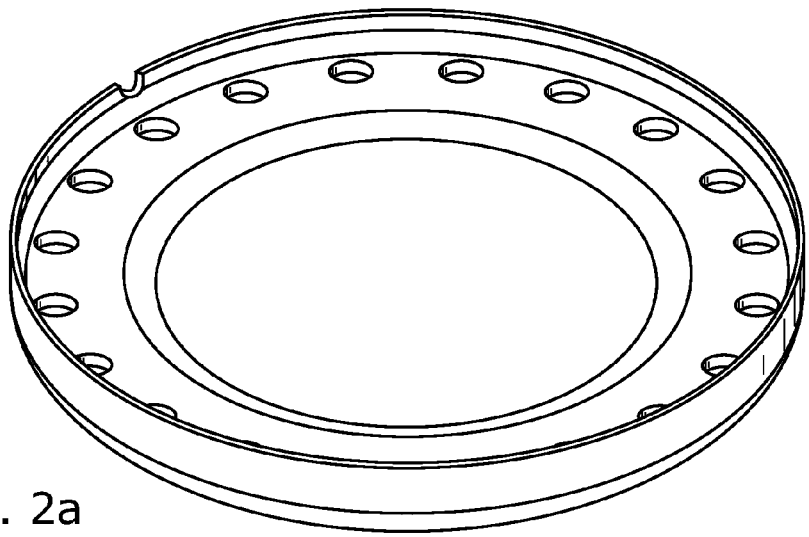
FIG. 2(a) is a perspective view of an aluminium element of the shield assembly.
Figure 2B:
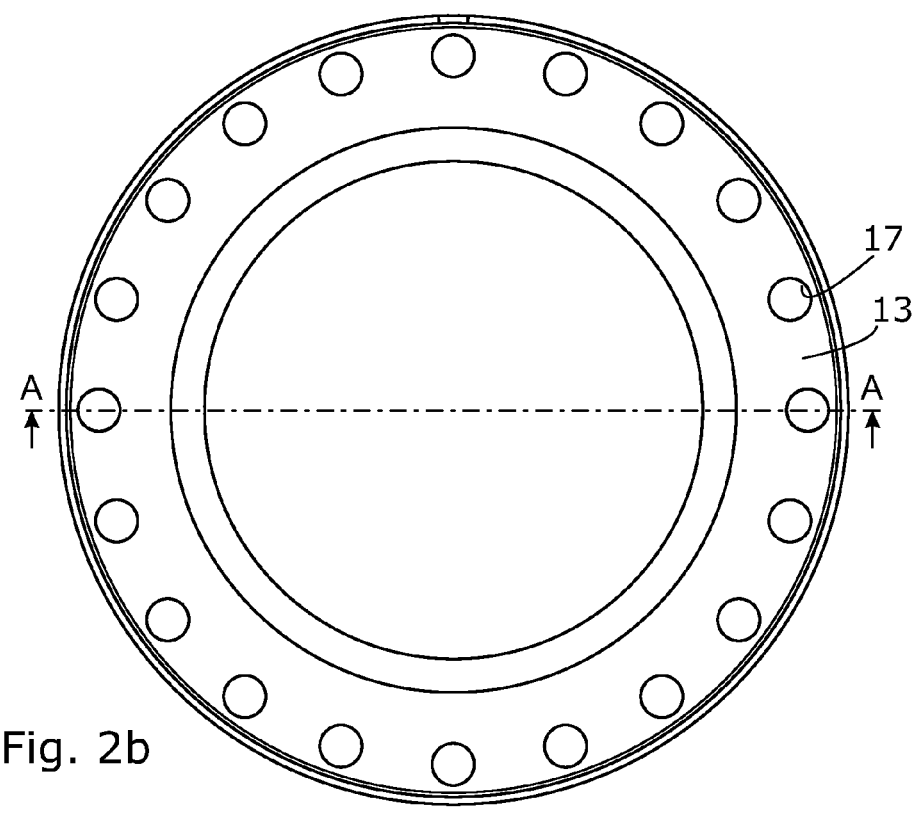
FIG. 2(b) is a view from above of that assembly and FIG. 2(c) is a cross section of the line A-A in FIG. 2(b)
Figure 2C:
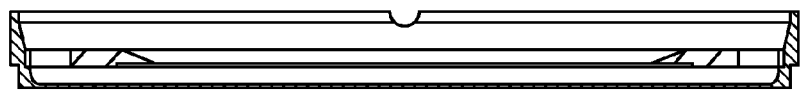

FIG. 1 shows the composite assembly 10 in a PVD process chamber 11. An Al shield element 13 is placed above the wafer 16, at a wafer location, in the region where the heat flux is typically at a maximum for the shielding. The shield element 13 acts as a shadow shield. The Al shield element 13 is held there by a stainless steel shield element 14 to form the assembly 10. The stainless steel shield element 14 extends along the wall 15 of the chamber 11 and beneath the Al shield element 13. Parts need to be a very tight fit (press fit (spec +0.1 to +0.3 mm) as indicated in FIG. 2) to ensure the full benefits of the composite are realized, i.e., the coupling between the Al and stainless steel of the shield elements 13 and 14 needs to be intimate (as the shielding heats up the Al shield element 13 expands into the stainless steel shield element 14 and provides an even better thermal contact). Contact between the outer stainless steel shielding and the inner wall of process chamber needs to be achieved for optimum dissipation of the heat generated during the deposition cycle. Note if the complete shielding was solely made from Al this would be a serious problem as it would tend to weld, for example friction weld, to the process chamber wall and be very difficult to remove during maintenance. The Al shield element 13 has a number of openings 17 to enable efficient pumping of the chamber.

FIG. 3 shows the excellent uniformity performance of the shielding over ~1100 kWhrs of high power 3 μm, 40 kW Al(Cu) deposition.

Distortion of the shielding close to the wafer edge (i.e., the Al shield element 13) would adversely affect the thickness of the deposition at the edge of the wafer. As FIG. 4 shows uniformity edge uniformity is maintained at the desired 100% level throughout the 1100 kWhrs with a 5 mm edge exclusion value.

Once thermally cycled the press fit parts behave like a single component.

Due to the Al ring being in close proximity to the wafer and the location of the stainless steel in contact with the Al chamber wall the thermal performance of the shielding is improved over a conventional stainless steel component. This enables high power deposition processes to be run for longer in production than would otherwise be the case.

Once the shielding needs to be changed the Al shield 13 can be replaced while the stainless steel exterior shielding can be cleaned and re-used.

What is claimed is:

1. A composite shield assembly for use in deposition apparatus defining a workpiece location, the assembly including:

a first shield element, constituting a shadow shield, for positioning circumjacent the workpiece location; and a second shield element extending around and carrying the first element, and wherein the first shield element consists of aluminium or an alloy thereof and the second shield element consists of stainless steel so that the thermal conductivity of the first element is greater than that of the second element, and the first element is disposed within and press or friction fit to the second element to place the first and second elements in contact with one another such that thermal energy will thereby transfer directly from the first element to the second element by conduction.

2. A deposition chamber comprising:

support structure defining a workpiece location at which a workpiece is processed; and a composite shield assembly including a first shield element circumjacent the workpiece location and configured as a shadow shield around the workpiece location, and a second shield element extending around and carrying the first element, and wherein the first shield element consists of aluminium or an alloy thereof and the second shield element consists of stainless steel so that the thermal conductivity of the first element is greater than that of the second element, and the first element is disposed within and press or friction fit to the second element such that the elements contact one another and thermal energy will transfer from the first element to the second element by conduction.

3. The chamber as claimed in claim 2 and having a chamber wall defining therein a processing space in which the workpiece location is defined and wherein the second element is disposed against the chamber wall so as to extend therealong and mounts the first element on the chamber wall.

4. The chamber as claimed in claim 3 wherein the second element forms a shield for part of the chamber wall.

5. A deposition apparatus comprising the deposition chamber as claimed in claim 2; and a power supply that delivers power to the deposition chamber, wherein the deposition chamber comprises:

support structure defining the workpiece location where a workpiece is processed.

6. The apparatus as claimed in claim 5 wherein the power supply is configured to deliver at least 30 kW to the deposition chamber.

7. The assembly as claimed in claim 1 wherein the first element is an annular element consisting of aluminum or an alloy thereof, and the second element is a cylindrical element consisting of stainless steel, and the first and second elements have an interface along an annular region of the assembly.

8. The assembly as claimed in claim 7 wherein the press or friction fit of the first element to the second element exists along the annular region such that thermal energy will transfer directly across the interface from an annular aluminium or aluminium alloy face of the first element to an annular stainless steel face of the second element.

9. The deposition chamber as claimed in claim 2 wherein the first element of the shield assembly is an annular element consisting of aluminum or an alloy thereof, and the second element of the shield assembly is a cylindrical element consisting of stainless steel, and the first and second elements have an interface along an annular region of the assembly.

10. The deposition chamber as claimed in claim 9 wherein the press or friction fit of the first element to the second element exists along the annular region such that thermal energy will transfer directly across the interface from an annular aluminium or aluminium alloy face of the first element to an annular stainless steel face of the second element.

11. The deposition apparatus as claimed in claim 5 wherein the first element of the shield assembly is an annular element consisting of aluminum or an alloy thereof, and the second element of the shield assembly is a cylindrical element consisting of stainless steel, and the first and second elements have an interface along an annular region of the assembly.

12. The deposition apparatus as claimed in claim 11 wherein the press or friction fit of the first element to the second element exists along the annular region such that thermal energy will transfer directly across the interface from an annular aluminium or aluminium alloy face of the first element to an annular stainless steel face of the second element.

13. The assembly as claimed in claim 1, wherein the second shield element projects radially inwardly from a location at which the first shield element is carried by the second shield element to a location under the first shield element.

14. The assembly as claimed in claim 7, wherein the radially innermost portion of the annular first shield element tapers in a radially inward direction.

15. The deposition chamber as claimed in claim 2, wherein the second shield element projects radially inwardly from a location at which the first shield element is carried by the second shield element to a location under the first shield element.

16. The deposition chamber as claimed in claim 2, wherein the bottom surface of the radially innermost portion of the annular first shield element is disposed above the level of the uppermost surface of the support structure, the uppermost surface of the support structure being a planar surface against which the workpiece rests as it is processed in the apparatus.

17. The deposition chamber as claimed in claim 16, wherein the radially innermost portion of the annular first shield element tapers in a radially inward direction.

18. The apparatus as claimed in claim 6, wherein the bottom surface of the radially innermost portion of the annular first shield element is disposed above the level of the uppermost surface of the support structure, the uppermost surface of the support structure being a planar surface against which the workpiece rests as it is processed in the apparatus.

19. The apparatus as claimed in claim 6, wherein the deposition chamber has a chamber wall including an inner peripheral surface delimiting a processing space in which the support structure is located, and the second element of the composite shield assembly has an outer peripheral surface disposed against the inner peripheral surface of the chamber wall so as to extend therealong, and the second element mounts the first element on the chamber wall.

20. A composite shield assembly made by a process of:

providing a first shield element consisting of aluminium or an alloy thereof, as a shadow shield, for positioning circumjacent the workpiece location;

providing a second shield element consisting of stainless steel so that the thermal conductivity of the first element is greater than that of the second element, and wherein the first shield element has a circumferential portion, and the second shield element also has a circumferential portion, the circumferential portions have inner and outer diameters, respectively, and the outer diameter is greater than the inner diameter by an amount in a range of +0.1 to +0.3 mm; and forcing the circumferential portions together with the circumferential portion having the outer diameter disposed within the circumferential portion having the inner diameter to press or friction fit the first shield element to the second shield element and thereby place the first and second elements in contact with one another such that thermal energy will transfer directly from the first element to the second element, via the circumferential portions thereof, by conduction.

\* \* \* \* \*